United States Patent
Ukeda et al.

[11] Patent Number: 6,069,055
[45] Date of Patent: May 30, 2000

[54] FABRICATING METHOD FOR SEMICONDUCTOR DEVICE

[75] Inventors: Takaaki Ukeda; Toshiki Yabu; Takashi Uehara; Mizuki Segawa, all of Osaka; Masatoshi Arai, Nara; Masaru Moriwaki, Osaka, all of Japan

[73] Assignee: Matsushita Electric Industrial Co., Ltd., Osaka, Japan

[21] Appl. No.: 08/886,859

[22] Filed: Jul. 1, 1997

[30] Foreign Application Priority Data

Jul. 12, 1996 [JP] Japan ..................... 8-183210

[51] Int. Cl.⁷ ..................................... H01L 21/76
[52] U.S. Cl. ................ 438/424; 438/297; 438/405
[58] Field of Search ..................... 438/296, 297, 438/404, 405, 424

[56] References Cited

U.S. PATENT DOCUMENTS

| | | | |
|---|---|---|---|
| 5,399,389 | 3/1995 | Konrad et al. | |
| 5,433,794 | 7/1995 | Fazan et al. | 148/33.3 |
| 5,491,108 | 2/1996 | Mieko et al. | |
| 5,506,168 | 4/1996 | Morita et al. | 438/424 |
| 5,702,977 | 12/1997 | Jang et al. | 216/38 |
| 5,786,262 | 7/1998 | Jang et al. | 438/424 |
| 5,795,811 | 8/1998 | Kim et al. | 438/404 |

FOREIGN PATENT DOCUMENTS 0 090 520   10/1983   European Pat. Off. .

OTHER PUBLICATIONS

Patent Abstracts Of Japan, vol. 015, No. 464 (E–1137), Nov. 25, 1991 & JP 03 198339 A (Handotai Process Kenkyusho:KK), Aug. 29, 1991.

*Primary Examiner*—John F. Niebling
*Assistant Examiner*—John Murphy
*Attorney, Agent, or Firm*—Pearne, Gordon, McCoy & Granger LLP

[57] ABSTRACT

The fabricating method for semiconductor devices in which the trench technique is employed to perform isolation between devices, and which comprises the steps of sequentially depositing a first film 2, 3 and a second film 4 on top of a silicon substrate 1, forming an element isolation trench 5 in the silicon substrate 1 with masking of the first film 2, 3 and second film 4 which have undergone patterning, and growing a silicon oxide film 6 that is generated by reaction of ozone and tetra-ethyl-ortho-silicate inside the element isolation trench where silicon is exposed.

7 Claims, 5 Drawing Sheets

FABRICATING METHOD FOR SEMICONDUCTOR DEVICE

BACKGROUND OF THE INVENTION

This present invention relates to a fabricating method of semiconductor devices, and more particularly relates to trench isolation technology.

As the shift to high density and miniaturized semiconductor devices has progressed, there has been a growing necessity for secure isolation between counterpart devices such as transistors. In recent years, the trench isolation technique has been adopted to conduct isolation between counterpart devices. When utilizing the trench isolation technique, it has been usual to manufacture the semiconductor device according to the procedure shown in the sectional process diagram of FIGS. 5A to 5F.

First, as shown in FIG. 5A, a silicon substrate 51 which has undergone ion injection for purposes of well formation and a threshold voltage control is prepared, and then sequentially a gate oxide film 52 and a polysilicon film 53 are deposited on the surface of this silicon substrate 51. Subsequently, as shown in FIG. 5B, an element isolation trench 54 is formed in the interior of the silicon substrate 51 by dry etching after masking of the gate oxide film 52 and the polysilicon film 53 which have undergone patterning. Next, as shown in FIG. 5C, a silicon oxide film 55 is deposited as an insulating film having a conformable deposition shape by means of CVD utilizing silane type (SiH4) gas.

Next, when the surface is flattened by utilizing the chemical machinery polishing method (CMP method) or etch back method which uses the polysilicon film 53 as a stopper, the silicon oxide film 55 becomes embedded in the interior of the element isolation trench 54 which is formed in the silicon substrate 51, as shown in FIG. 5D. Furthermore, after a tungsten silicide film 56 is deposited as shown in FIG. 5E, the gate oxide film 52, polysilicon film 53 and tungsten silicide film 56 are subjected to patterning by dry etching, whereupon a transistor is completed with the required configuration and furnished with a gate electrode as shown in FIG. 5F.

When the semiconductor device is manufactured utilizing the trench isolation technique, the edge shape of the element isolation trench 54 exercises a major influence on the properties of the device. As shown in FIG. 5D, in the case where the surface of the silicon oxide film 55 embedded inside the element isolation trench 54 is etched lower than the surface of the silicon substrate 51, not only does there occur a hump phenomenon and a reverse narrow channel effect in the sub-threshold properties, but there also occurs an insufficiency in focal depth at the time of photolithography. In the flattening step when utilizing the trench isolation technique, it is necessary to perform a flattening treatment with superior in-plane uniformity and without pattern dependency. Consequently, it is necessary to make the film thickness of the silicon oxide film 55 during embedding as thin as possible, and to make the surface irregularities prior to flattening as small as possible.

However, as high density and miniaturization progress, it is necessary to form ever deeper element isolation trenches 54 between the device counterparts. Considering that it is necessary to deposit a silicon oxide film 55 of thick film thickness in order to bury a deep element isolation trench 54, one is compelled, as shown in FIG. 5C, to use a silicon oxide film 55 of thick film thickness possessing a conformable deposition shape. It is difficult to make the surface irregularities small prior to flattening. In particular, when the isolation trench 54 has a width more than twice the film thickness of the silicon oxide film 55, it is impossible to prevent the surface of the silicon oxide film 55, which is embedded in the isolation trench 54, from being etched lower than the surface of the silicon substrate. Furthermore, when the silicon oxide film 55 of thick film thickness is deposited, there is a reduction in the in-plane uniformity of the film thickness itself possessed by the silicon oxide film 55, and there is a problem that it is difficult to obtain superior in-plane uniformity after flattening.

SUMMARY OF THE INVENTION

The present invention has been made in light of these conventional problems, and its object is to provide a fabricating method for semiconductor devices which can easily accomplish a flattening with superior in-plane uniformity and with little pattern dependency.

In order to achieve the above object, according to the present invention, the fabricating method for semiconductor devices comprises the steps of sequentially depositing a first film and a second film on a silicon substrate, forming an element isolation trench in the silicon substrate with masking of the first film and second film which have undergone patterning, and growing a silicon oxide film that is generated by reaction of ozone and tetra-ethyl-ortho-silicate (TEOS) inside the element isolation trench where silicon is exposed. The method of the present invention has been formulated with attention to the fact that the deposition properties of the silicon oxide film generated by the reaction of ozone and tetra-ethyl-ortho-silicate (hereinafter referred to as TEOS) are strongly dependent on the film property of the substrate. The fact that the deposition properties of the silicon oxide film generated by the reaction of ozone and TEOS are strongly dependent on the film property of the substrate is discussed in U.S. Pat. No. 5,399,389.

That is, with regard to the silicon oxide film generated by the reaction of ozone and TEOS in this occasion, it possesses the deposition properties that growth occurs easily on silicon, but with difficulty on non-silicon substrates. Particularly, under a certain condition of the reaction between the ozone and the TEOS, no silicon oxide film is formed on non-silicon substrates. Thus, it is possible to realize flattening with superior in-plane uniformity and with little pattern dependency by the selective growth of silicon oxide film in an element isolation trench where silicon is exposed.

According to the present invention, the fabricating method for semiconductor devices comprises the steps of sequentially depositing a first film and a second film on a silicon substrate, forming an element isolation trench in the silicon substrate with masking of the first film and second film which have undergone patterning, and growing a silicon oxide film that is generated by reaction of ozone and tetra-ethyl-ortho-silicate inside the element isolation trench where silicon is exposed.

Further, according to present invention, the second film is a silicon oxide film, and the method further comprises a step of removing the silicon oxide film which is the second film after generation of the silicon oxide film by the reaction of ozone and tetra-ethyl-ortho-silicate. Furthermore, the second film may be a conductive film. In this case, the conductive film is a metallic silicide film or a metallic film.

According to the semiconductor device fabricating method, it becomes possible to embed silicon oxide film at least in an element isolation trench, that is, in an element isolation trench where silicon is exposed after growth of the silicon oxide film in that element isolation trench so that it becomes possible to realize flattening with superior in-plane uniformity and with little pattern dependency.

DETAILED DESCRIPTION OF THE PREFERRED EMBODIMENTS

Embodiments of the present invention will be described hereinafter with reference to the drawings.

First Embodiment

FIGS. 1A to 1G are sectional process diagrams showing the procedure of the fabricating method for semiconductor devices pertaining to first embodiment. The semiconductor device of this embodiment is manufactured according to the procedure shown in FIGS. 1A to 1G.

Figure 1A:
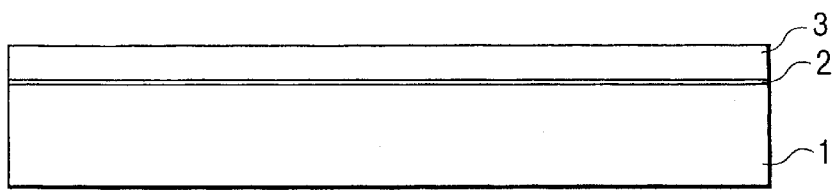
FIGS. 1A to 1G are sectional process diagrams showing the procedure of the fabricating method for semiconductor devices pertaining to first embodiment.
Figure 1B:
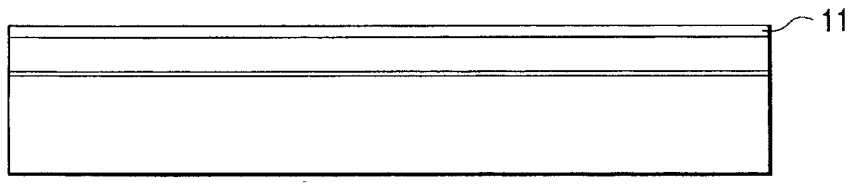
Figure 1C:
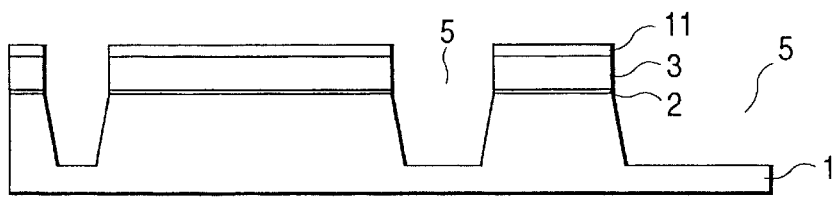

First, as shown in FIG. 1A, a silicon substrate 1 which has undergone ion injection for purposes of well formation and threshold voltage control is prepared, and then a gate oxide film 2 and a polysilicon film 3 are respectively deposited in sequence on the surface of this silicon substrate 1 as the first film. As shown in FIG. 1B, a silicon oxide film 11 which is the second film is then deposited on the polysilicon film 3. Next, as shown in FIG. 1C, an element isolation trench 5 is formed inside the silicon substrate 1 by performing dry etching after the masking of the gate oxide film 2 and the polysilicon film 3 and the silicon oxide film 11 which have undergone patterning.

Figure 1D:
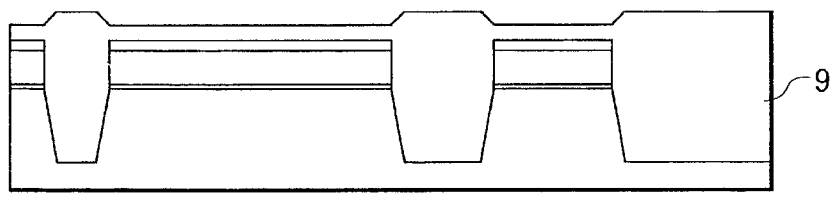

Next, as shown in FIG. 1D, a silicon oxide film 9 generated by the reaction of ozone ($O_3$) and tetra-ethyl-ortho-silicate (TEOS: $Si(OC_2H_5)_4$) is grown on the silicon oxide film 11 and inside the element isolation trench 5. Here, the silicon oxide film 9 of this embodiment is deposited not only inside the element isolation trench 5 where the silicon is exposed, but also on the silicon oxide film 11 which is the second film. In this instance, based on the selective deposition properties of the silicon oxide film 9, the film thickness of the silicon oxide film 9 deposited on the silicon oxide film 11 is thinner than the silicon oxide film 9 deposited inside the element isolation trench 5. For example, the reaction between the ozone and TEOS is performed under a condition that ozone concentration in the oxygen being 10 weight %, pressure being 1 bar, and temperature being 400° C.

Figure 1E:
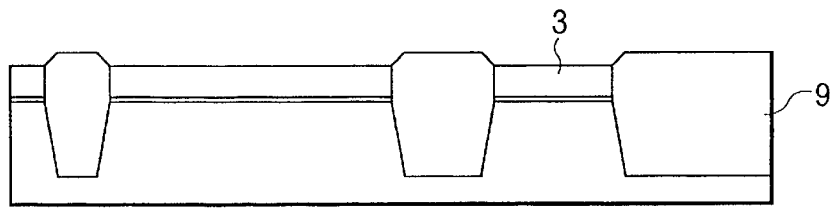
Figure 1F:
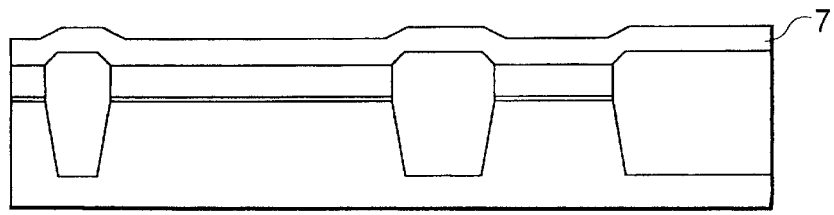
Figure 1G:
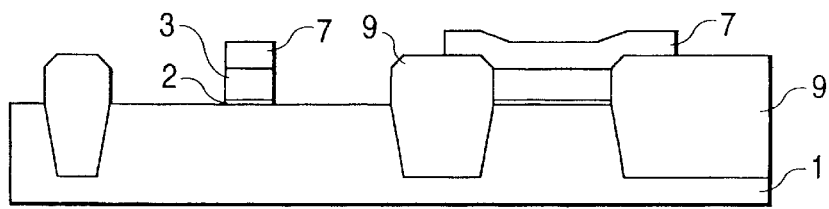

Next, as shown in FIG. 1E, the silicon oxide films 9 and 11 deposited on the polysilicon film 3 are respectively removed by surface flattening treatment utilizing the chemical machinery polishing method or the etch back method, with the result that the silicon oxide film 9 remains only inside the element isolation trench formed in the silicon substrate 1. Thus, in this instance, because of the silicon oxide film 9 on the silicon oxide film 11 being thinner than the silicon oxide film 9 inside the isolation trench 5, it is done in a short treatment time compared to the case of removal of the silicon oxide film 55 by the conventional method, and there is an advantage that in-plane uniformity is improved and pattern dependency is reduced. Furthermore, after a tungsten silicide film 7 has been deposited over the entire surface as shown in FIG. 1F, the gate oxide film 2, polysilicon film 3 and tungsten silicide film 7 undergo patterning by dry etching, whereupon a transistor is completed with the required configuration and furnished with a gate electrode as shown in FIG. 1G.

Second Embodiment

FIGS. 2A to 2G are sectional process diagrams showing the procedure of the fabricating method for semiconductor devices pertaining to second Embodiment. The semiconductor device of this embodiment is manufactured according to the following procedure shown in FIGS. 2A to 2G. In these FIGS. 2A to 2G, the substrate and films identical to those in FIGS. 1A to 1G are given the same reference numerals correspondingly.

Figure 2A:
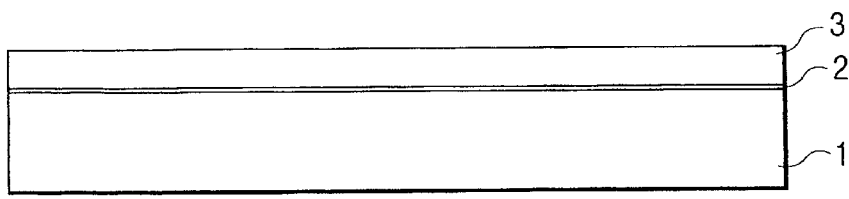
FIGS. 2A to 2G are sectional process diagrams showing the procedure of the fabricating method for semiconductor devices pertaining to second embodiment.
Figure 2B:
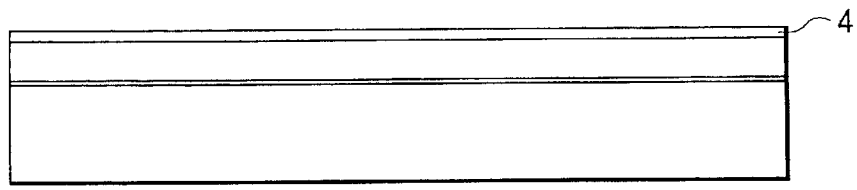
Figure 2C:
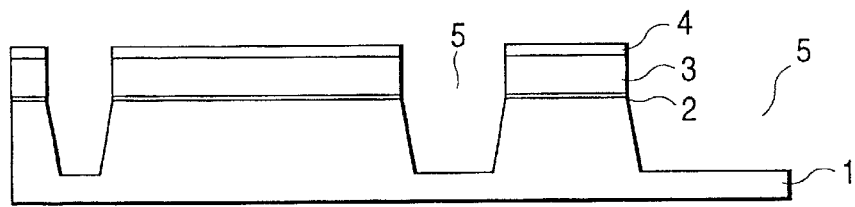

First, as shown in FIG. 2A, a silicon substrate 1 which has undergone ion injection for purposes of well formation and threshold voltage control is prepared, and then a gate oxide film 2 which is the first film and a polysilicon film 3 are respectively deposited in sequence on the surface of this silicon substrate 1. As shown in FIG. 2B, a tungsten silicide film 4, which serves as a conductive film and which is the second film, is then deposited on the polysilicon film 3. Next, as shown in FIG. 2C, an element isolation trench 5 is formed in the silicon substrate 1 by performing dry etching after the masking of the gate oxide film 2 and polysilicon film 3 which have undergone patterning, and the tungsten silicide film 4.

Figure 2D:
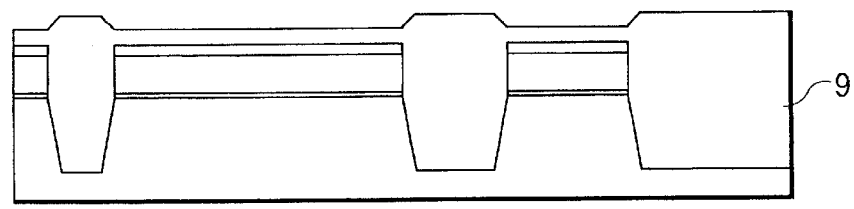

Next, as shown in FIG. 2D, a silicon oxide film 9 generated by the reaction of ozone and TEOS is grown on the tungsten silicide film 4 and in the element isolation trench 5. That is, in this instance, the silicon oxide film 9 generated by the reaction with TEOS is deposited not only in the element isolation trench 5 where the silicon is exposed, but also on the tungsten silicide film 4. Based on the selective deposition properties of the silicon oxide film 9, the film thickness of the silicon oxide film 9 deposited on the tungsten silicide film 4 is thinner than in the element isolation trench 5, and the silicon oxide film 9 is embedded in the interior of the element isolation trench 5 formed in the silicon substrate 1.

Figure 2E:
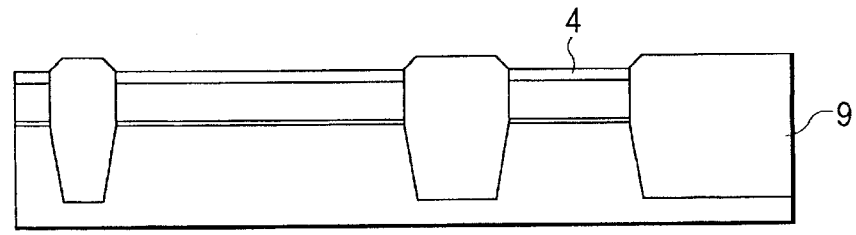
Figure 2F:
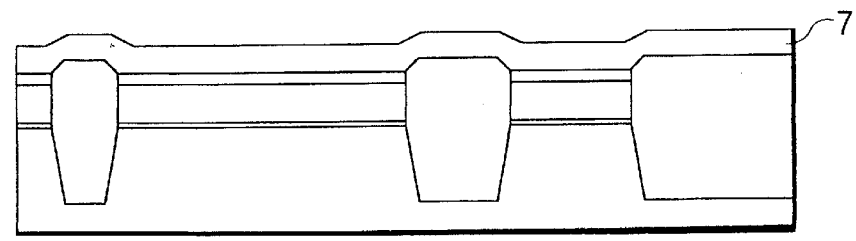
Figure 2G:
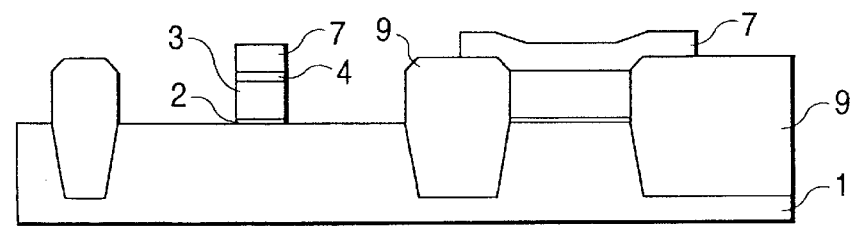

Next, as shown in FIG. 2E, the silicon oxide film 9 deposited thinly on the tungsten silicide film 4 is removed by utilizing the chemical machinery polishing method or the etch back method to thereby flatten the surface. Thereafter, as shown in FIG. 2F, a tungsten silicide film 7 is deposited over the entire surface. In this instance, it is necessary to perform surface flattening treatment in order to remove the silicon oxide film 9 deposited on the tungsten silicide film 4, but since this is done in a short treatment time compared to the case of removal of the silicon oxide film 55 of thick film thickness which is deposited with the conventional method, there is an advantage that in-plane uniformity is improved and pattern dependency is reduced. Furthermore, if the gate oxide film 2, the polysilicon film 3, and the tungsten silicide films 4 and 7 undergo patterning by dry etching, the transistor with the required configuration furnished with a gate electrode as shown in FIG. 2G is completed.

In the above-mentioned first embodiment, it is necessary to remove the silicon oxide film 9 and the silicon oxide film 11 deposited on the polysilicon film 3. According to the second embodiment, it is sufficient to remove only the silicon oxide film 9 deposited on the tungsten silicide film 4. Additionally, the tungsten silicide film 4 serving as the etching mask is a conductive film, and the tungsten silicide film 4 also serves as a dummy layer during the surface flattening treatment such as the chemical machinery polishing method. Therefore, a margin of over polishing (CMP) or over etching (dry etching) for removing the silicon oxide film 9 is sufficiently ensured. Thus, the silicon oxide film 9 do not remain on the tungsten silicide film 4, so that the electrodes made of tungsten silicide film 7 are securely contacted with the tungsten silicide film 4.

Incidentally, with regard to second Embodiment, the conductive film used as the second film is the tungsten silicide film 4, but the conductive film is not limited to this tungsten silicide film 4. It is, of course, acceptable to use, for example, other metallic silicide films such as a titanium-silicide film or a cobalt-silicide film, or metallic or metallic alloy films such as aluminum or tungsten.

Third Embodiment

FIGS. 3A to 3G are sectional process diagrams showing the procedure of the fabricating method for semiconductor devices pertaining to third embodiment. The semiconductor device of this embodiment is shown in FIGS. 3A to 3G, and is manufactured with use of trench isolation technology according to the following procedure. In these FIGS. 3A to 3G, a substrate and films identical to those in FIGS. 1A to 1G are given the same reference numerals correspondingly.

Figure 3A:
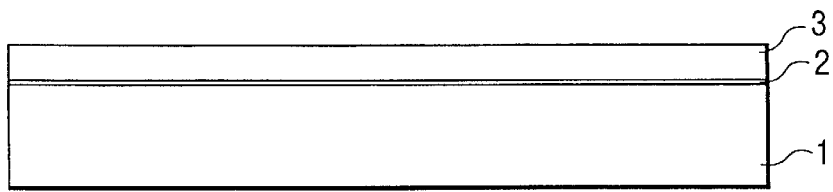
FIGS. 3A to 3G are sectional process diagrams showing the procedure of the fabricating method for semiconductor devices pertaining to third embodiment.
Figure 3B:
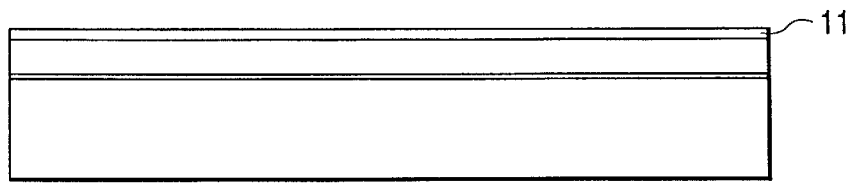
Figure 3C:
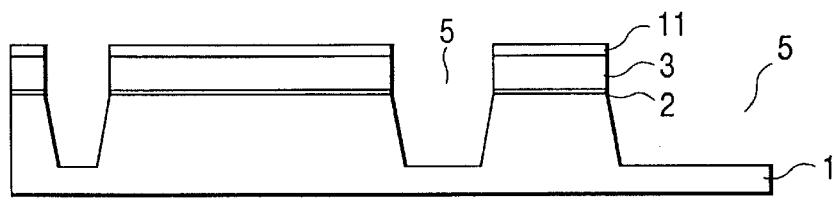

First, as shown in FIG. 3A, a silicon substrate 1 which has undergone ion injection for purposes of well formation and threshold voltage control is prepared, and then a gate oxide film 2 which is the first film and a polysilicon film 3 are respectively deposited in sequence on the surface of this silicon substrate 1. As shown in FIG. 3B, a silicon oxide film 11 of thin film thickness is then deposited as the second film on top of the polysilicon film 3 by thermal oxidation or CVD utilizing a silane type gas. Next, as shown in FIG. 3C, an element isolation trench 5 is formed in the silicon substrate 1 by performing dry etching after the masking of the gate oxide film 2 and polysilicon film 3 which have undergone patterning, and the silicon oxide film 11.

Figure 3D:
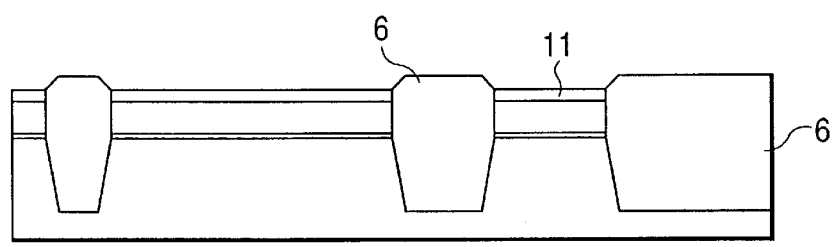

Next, as shown in FIG. 3D, under an optimum condition in that the selectivity of the deposition property is remarkably apparent, a silicon oxide film 6 generated by the reaction of ozone and TEOS is grown only inside the element isolation trench 5 where the silicon is exposed. That is, in this instance as well, since the silicon oxide film 6 generated under the optimum condition grows only on top of silicon, and does not grow on the silicon oxide film 11 which is the second film, the new silicon oxide film 6 generated by the reaction of high concentration ozone and TEOS grows only inside the element isolation trench 5. As a result, the silicon oxide film 6 becomes embedded inside the element isolation trench 5 formed in the silicon substrate 1.

Figure 3E:
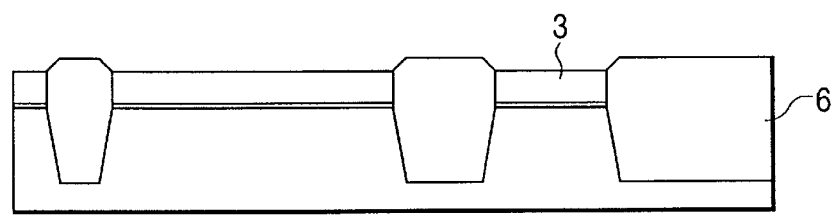
Figure 3F:
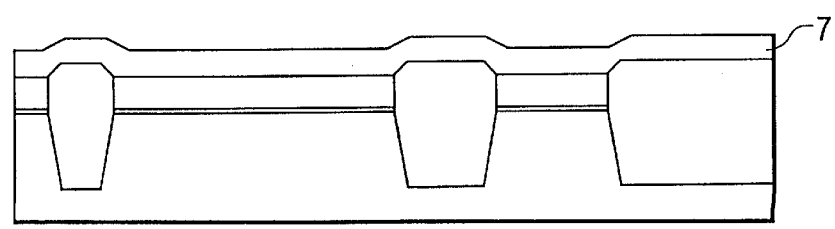
Figure 3G:
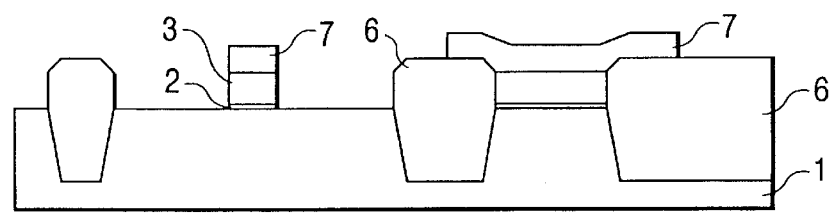

Next, as shown in FIG. 3E, the silicon oxide film 11 is removed by surface flattening treatment utilizing the chemical machinery polishing method or the etch back method. As the film thickness of the silicon oxide film 11 which is the second film is thin, the surface flattening treatment in this instance is very simple, and contributes to improved in-plane uniformity and reduced pattern dependency. Furthermore, after a tungsten silicide film 7 is deposited over the entire surface as shown in FIG. 3F, the gate oxide film 2, the polysilicon film 3 and the tungsten silicide film 7 undergo patterning by dry etching, whereupon a transistor is completed with the required configuration furnished with a gate electrode as shown in FIG. 3G.

Fourth Embodiment

FIGS. 4A to 4F are sectional process diagrams showing the procedure of the fabricating method for semiconductor devices pertaining to fourth Embodiment. The semiconductor device utilizing trench isolation technology is manufactured according to the procedure shown in FIGS. 4A to 4F.

Figure 4A:
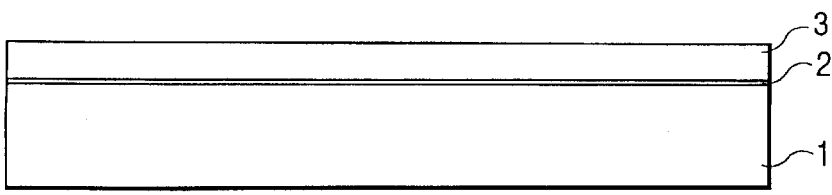
FIGS. 4A to 4F are sectional process diagrams showing the procedure of the fabricating method for semiconductor devices pertaining to fourth embodiment.
Figure 4B:
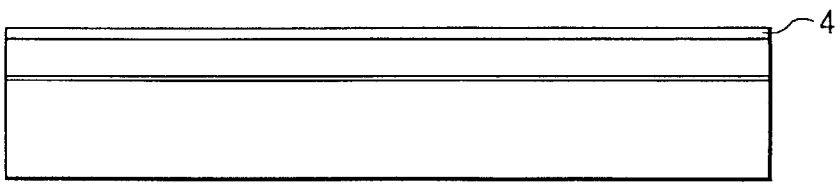
Figure 4C:
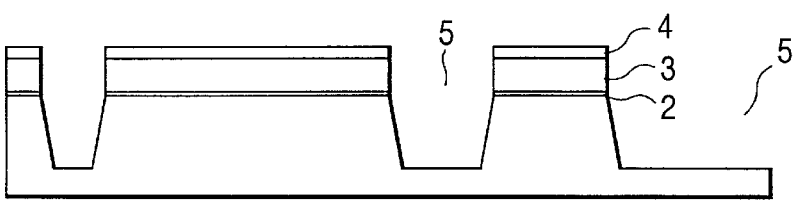

First, as shown in FIG. 4A, a silicon substrate 1 which has undergone ion injection for purposes of well formation and threshold voltage control is prepared, and a gate oxide film 2 which is the first film and a polysilicon film 3 are respectively deposited in sequence on the surface of this silicon substrate 1. Thereafter, as shown in FIG. 4B, a tungsten silicide film 4 is deposited on the polysilicon film 3 as a conductive film which is the second film. Then, as shown in FIG. 4C, an element isolation trench 5 is formed in the interior of the silicon substrate 1 by performing dry etching after the masking of the gate oxide film 2 and the polysilicon film 3, which have undergone patterning, and the tungsten silicide film 4.

Figure 4D:
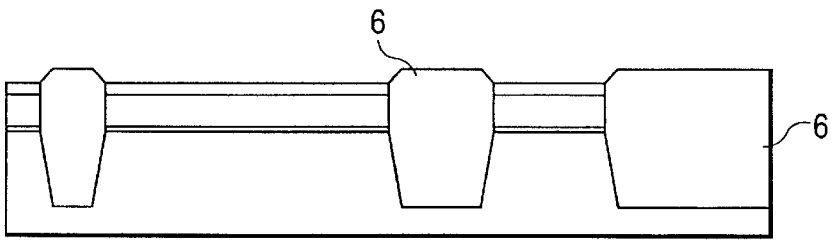

Next, as shown in FIG. 4D, under an optimum condition in that the selectivity of the deposition property is remarkably apparent, a silicon oxide film 6 which is generated by the reaction of ozone and TEOS is grown only in the element isolation trench 5 where the silicon is exposed. In short, in this instance, since the silicon oxide film 6 generated in the optimum condition has the selective deposition property that it grows only on top of silicon, and does not grow on a metallic silicide film or a metallic film, the silicon oxide film 6 is deposited by growing only inside the element isolation trench 5. As a result, the silicon oxide film 6 becomes embedded inside the element isolation trench 5 formed in the silicon substrate 1.

Figure 4E:
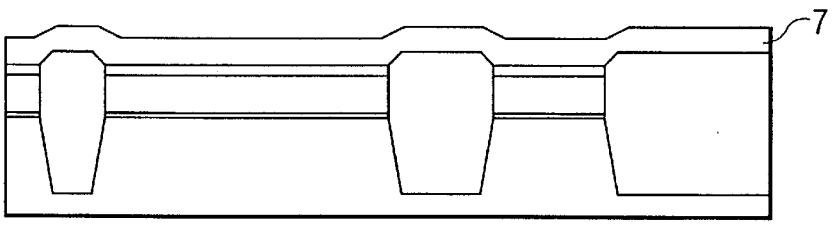
Figure 4F:
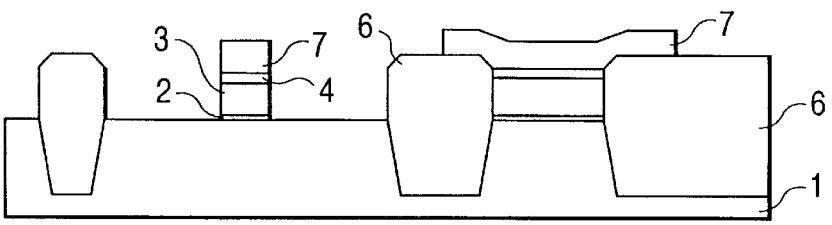
Figure 5A:
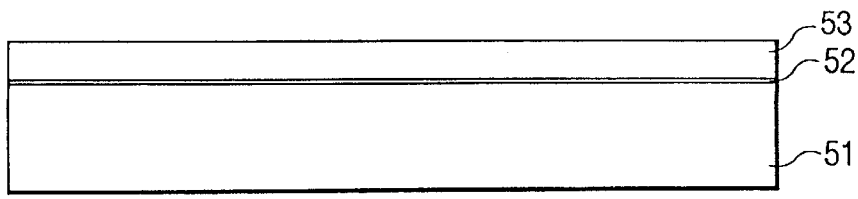
FIGS. 5A to 5F are sectional process diagrams showing the procedure of the fabricating method for semiconductor devices pertaining to a conventional art.
Figure 5B:
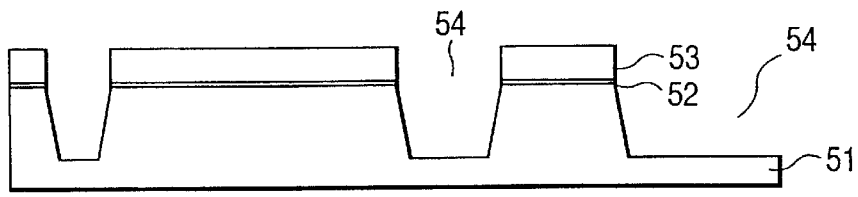
Figure 5C:
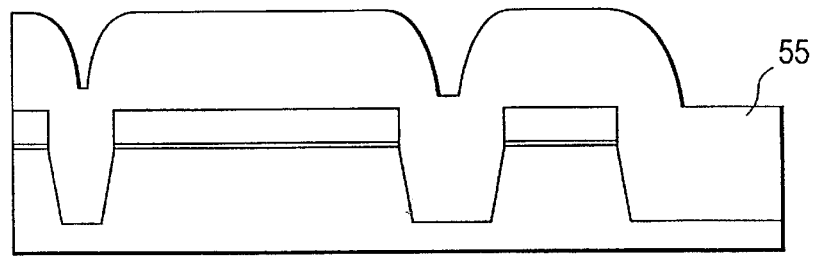
Figure 5D:
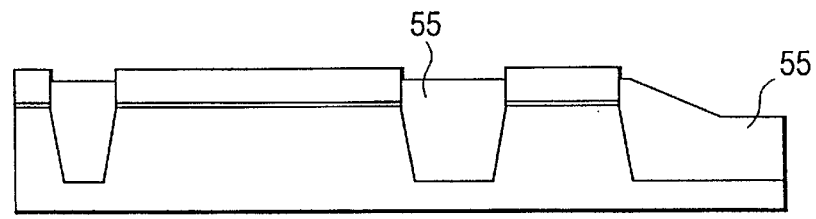
Figure 5E:
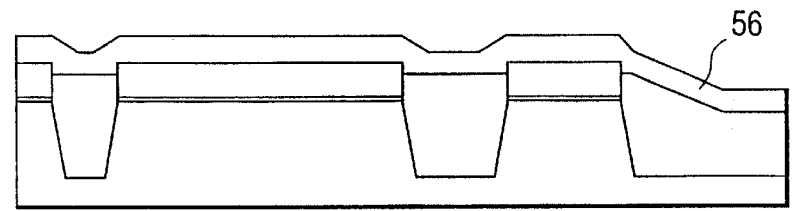
Figure 5F:
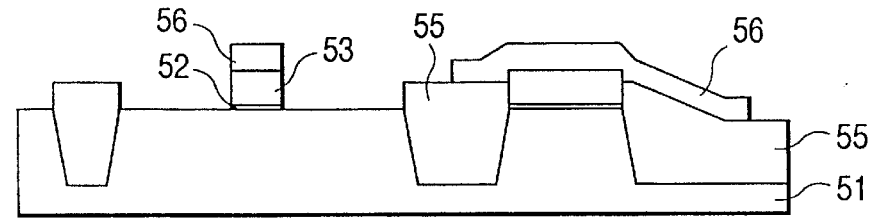

Next, according to necessity, surface flattening treatment is conducted utilizing the chemical machinery polishing method or the like. However, from the deposition properties of the silicon oxide film 6, it can be assumed that there is no deposition of silicon oxide film 6 on the tungsten silicide film 4. Accordingly, it is possible to omit the surface flattening in this instance, or to limit the treatment to the removal of surface roughness. Next, as shown in FIG. 4E, after deposition of a tungsten silicide film 7 over the entire surface, patterning is made on the gate oxide film 2, polysilicon film 3, and tungsten silicide films 4 and 7 by dry-etching, whereupon the transistor is completed with the required configuration furnished with a gate electrode, as shown in FIG. 4F.

Thus, as explained above, in the fabricating method for semiconductor devices pertaining to this fourth Embodiment, there is no deposition of a silicon oxide film 55 in the conventional method—that is, a silicon oxide film 55 of thick film thickness and conformable deposition shape. Consequently, there is no need whatsoever to perform surface flattening for purposes of removing this silicon oxide film 55. Incidentally, with regard to this fourth Embodiment, the conductive film used as the second film is the tungsten silicide film 4, but the conductive film is not limited to this tungsten silicide film 4. It is, of course, acceptable to use, for example, other metallic silicide films such as a titanium-silicide film or a cobalt-silicide film, or metallic or metallic alloy films such as aluminum or tungsten.

As explained above, with the fabricating method for semiconductor devices according to the present invention, by using high ozone with silicon oxide film as the second film, the silicon oxide film generated by the reaction of this ozone and TEOS is deposited inside the element isolation trench where the silicon is exposed, and the silicon oxide film is embedded inside this element isolation trench. Accordingly, one can manufacture the semiconductor device by conducting surface flattening treatment only to remove the silicon oxide film as the second film which was thinly deposited in advance and the silicon oxide film thinly deposited on the second film by reaction of the ozone and TEOS. Then, one can realize flattening with superior in-plane uniformity and little pattern dependency.

Furthermore, with the fabricating method for semiconductor devices according to the present invention, by using ozone with a conductive film as the second film, the silicon oxide film generated by the reaction of this ozone and TEOS is deposited inside the element isolation trench where the silicon is exposed, and the silicon oxide film is embedded inside this element isolation trench. Consequently, there is the effect that it is not necessary to conduct surface flattening or that it is only necessary to conduct flattening treatment to the extent of removing surface roughness, and that it is possible to realize flattening with superior in-plane uniformity and little pattern dependency.

What is claimed is:

1. A fabricating method for semiconductor devices comprising the steps of:

depositing a film on a silicon substrate;

patterning said film;

forming an isolation trench in said silicon substrate with masking of said patterned film; and growing a silicon oxide film that is generated by reaction of ozone and tetra-ethyl-ortho-silicate (TEOS) at least inside said isolation trench where silicon is exposed;

wherein when said silicon oxide film is formed by reaction of ozone and tetra-ethyl-ortho-silicate (TEOS), the concentration of said ozone is optimized so as to cause a growing rate of said silicon oxide film on said film to be lower than that in said isolation trench where said silicon substrate is exposed, so that a surface of the silicon oxide formed inside the isolation trench is made higher than a surface of the silicon oxide formed on said film.

2. A fabricating method according to claim 1, wherein said film is a conductive film or a silicon oxide film.

3. A fabricating method according to claim 2, wherein said conductive film is a metallic silicide film, a metallic film, or a metallic alloy film.

4. A fabricating method for a transistor, comprising the steps of:

depositing a gate oxide film and a polysilicon film on a silicon substrate;

depositing a mask film on said polysilicon film, a growing rate of a silicon oxide film generated by reaction of ozone and tetra-ethyl-ortho-silicate (TEOS) thereon is lower than that on the silicon substrate;

patterning said gate oxide film, said polysilicon film, and said mask film;

forming an isolation trench in said silicon substrate with masking of said mask film which have undergone patterning; and growing a silicon oxide film that is generated by reaction of ozone and tetra-ethyl-ortho-silicate (TEOS) at least inside said isolation trench where silicon is exposed, wherein when said silicon oxide film is formed by reaction of ozone and tetra-ethyl-ortho-silicate (TEOS), the concentration of said ozone is optimized to cause a growing rate of said silicon oxide film on said mask film to be lower than that in said isolation trench where said silicon substrate is exposed, so that a surface of the silicon oxide formed inside the isolation trench is made higher than a surface of the silicon oxide formed on said mask film.

5. A fabricating method according to claim 4, wherein said mask film is a conductive film or a silicon oxide film.

6. A fabricating method according to claim 5, wherein said conductive film is a metallic silicide film, a metallic film or a metallic alloy film.

7. A fabricating method according to claim 4, further comprising a step of forming a gate electrode by patterning at least said gate oxide film and said polysilicon film after growing of said silicon oxide.

* * * * *